(12) United States Patent
SeyedzadehDelcheh

(10) Patent No.: US 12,019,879 B2
(45) Date of Patent: Jun. 25, 2024

(54) MULTI-LEVEL CELL MEMORY MANAGEMENT

(71) Applicant: Advanced Micro Devices, Inc., Santa Clara, CA (US)

(72) Inventor: SeyedMohammad SeyedzadehDelcheh, Sammamish, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 5 days.

(21) Appl. No.: 17/952,268

(22) Filed: Sep. 25, 2022

(65) Prior Publication Data

US 2024/0103739 A1   Mar. 28, 2024

(51) Int. Cl.
*G06F 3/06* (2006.01)

(52) U.S. Cl.
CPC .......... *G06F 3/0619* (2013.01); *G06F 3/0659* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 11,416,323 B2 | 8/2022 | Seyedzadehdelcheh et al. | |
| 11,416,419 B2 | 8/2022 | Seyedzadehdelcheh | |
| 2008/0215800 A1* | 9/2008 | Lee | G06F 12/1416 |
| | | | 711/E12.098 |
| 2017/0047124 A1* | 2/2017 | Ellis | G06F 3/0637 |
| 2018/0081594 A1* | 3/2018 | Jung | G11C 16/3495 |
| 2018/0165032 A1* | 6/2018 | Bandic | G06F 3/0611 |
| 2019/0130972 A1* | 5/2019 | Jeong | G11C 29/46 |
| 2020/0310646 A1* | 10/2020 | Song | G11C 11/5628 |
| 2021/0191797 A1 | 6/2021 | Seyed et al. | |

OTHER PUBLICATIONS

Choi, Jungwhan, et al., "DC-PCM: Mitigating PCM Write Disturbance with Low Performance Overhead by Using Detection Cells", IEEE Transactions on Computers, vol. 68, No. 12 [retrieved Aug. 8, 2022]. Retrieved from the Internet <DOI: 10.1109/TC.2019.2930972>., Jul. 25, 2019, 14 Pages.

(Continued)

*Primary Examiner* — Charles J Choi
(74) *Attorney, Agent, or Firm* — FIG. 1 Patents

(57) ABSTRACT

Multi-level cell memory management techniques are described. In one example, the memory controller is configured to control whether a single-level cell operation or a multi-level cell operation to be used using different mapping schemes. The single-level cell operation, for instance, is usable to store a data word using two states whereas the multi-level cell operation is usable to store the data word by also using an intermediate state. In order to store the data word using two states, the memory controller is configurable to separate the data word across two word lines in the physical memory. In an implementation, use of the different operations and corresponding mapping schemes by the memory controller alternates between adjacent word lines in physical memory.

20 Claims, 9 Drawing Sheets

(56) References Cited

OTHER PUBLICATIONS

Jiang, Lei, et al., "Mitigating Write Disturbance in Super-Dense Phase Change Memories", IEEE/IFIP International Conference on Dependable Systems and Networks [retrieved Aug. 2, 2022]. Retrieved from the Internet <https://people.cs.pitt.edu/~zhangyt/research/dsn2014.pdf>., Jun. 2014, 12 Pages.

Longofono, Stephen, et al., "Virtual Coset Coding for Encrypted Non-Volatile Memories with Multi-Level Cells", IEEE International Symposium on High-Performance Computer Architecture (HPCA) [retrieved Aug. 2, 2022]. Retrieved from the Internet <https://arxiv.org/pdf/2112.01658.pdf>., Dec. 3, 2021, 13 Pages.

Swami, Shivam, et al., "ADAM: Architecture for write disturbance mitigation in scaled phase change memory", 2018 Design, Automation & Test in Europe Conference & Exhibition [retrieved Aug. 2, 2022]. Retrieved from the Internet <https://past.date-conference.com/proceedings-archive/2018/pdf/0298.pdf>., Mar. 2018, 6 Pages.

Wang, Rujia, et al., "SD-PCM: Constructing reliable super dense pcm under write disturbance", ACM SIGARCH Computer Architecture News, vol. 43, No. 1 [retrieved Aug. 2, 2022]. Retrieved from the Internet <https://people.cs.pitt.edu/~zhangyt/research/asplos2015.pdf>., Mar. 14, 2015, 13 Pages.

* cited by examiner

| Logic Addresses 904 (e.g., 16) | 902 | Physical Word Lines 906 (e.g., 24) |
|---|---|---|
| 0 | SLC | 0 |
| 1 | MLC | 1 |
| 0 | SLC | 2 |
| 3 | MLC | 3 |
| 2 | SLC | 4 |
| 5 | MLC | 5 |
| 2 | SLC | 6 |
| 7 | MLC | 7 |
| 4 | SLC | 8 |
| 9 | MLC | 9 |
| 4 | SLC | 10 |
| 11 | MLC | 11 |
| 6 | SLC | 12 |
| 13 | MLC | 13 |
| 6 | SLC | 14 |
| 15 | MLC | 15 |
| 8 | SLC | 16 |
| 8 | SLC | 17 |
| 10 | SLC | 18 |
| 10 | SLC | 19 |
| 12 | SLC | 20 |
| 12 | SLC | 21 |
| 14 | SLC | 22 |
| 14 | SLC | 23 |

MULTI-LEVEL CELL MEMORY MANAGEMENT

BACKGROUND

Memory devices and associated memory controllers are employed by computing systems to manage data storage as well as how this data is made available to processing devices, e.g., central processing units, graphics processing units, auxiliary processing units, parallel accelerated processor, and so forth. As such, efficiency in data storage directly affects operation of these devices, examples of which include processing speed, bandwidth, and power consumption. Accordingly, techniques have been developed to expand the ways, in which, data is stored by memory devices. Conventional techniques to do so, however, introduce additional challenges that cause these memory devices to fail in real-world scenarios.

BRIEF DESCRIPTION OF THE DRAWINGS

The detailed description is described with reference to the accompanying figures.

FIG. 9 is a block diagram of a non-limiting example of a mapping scheme for a second half of a word line.

DETAILED DESCRIPTION

Overview

Figure 1:
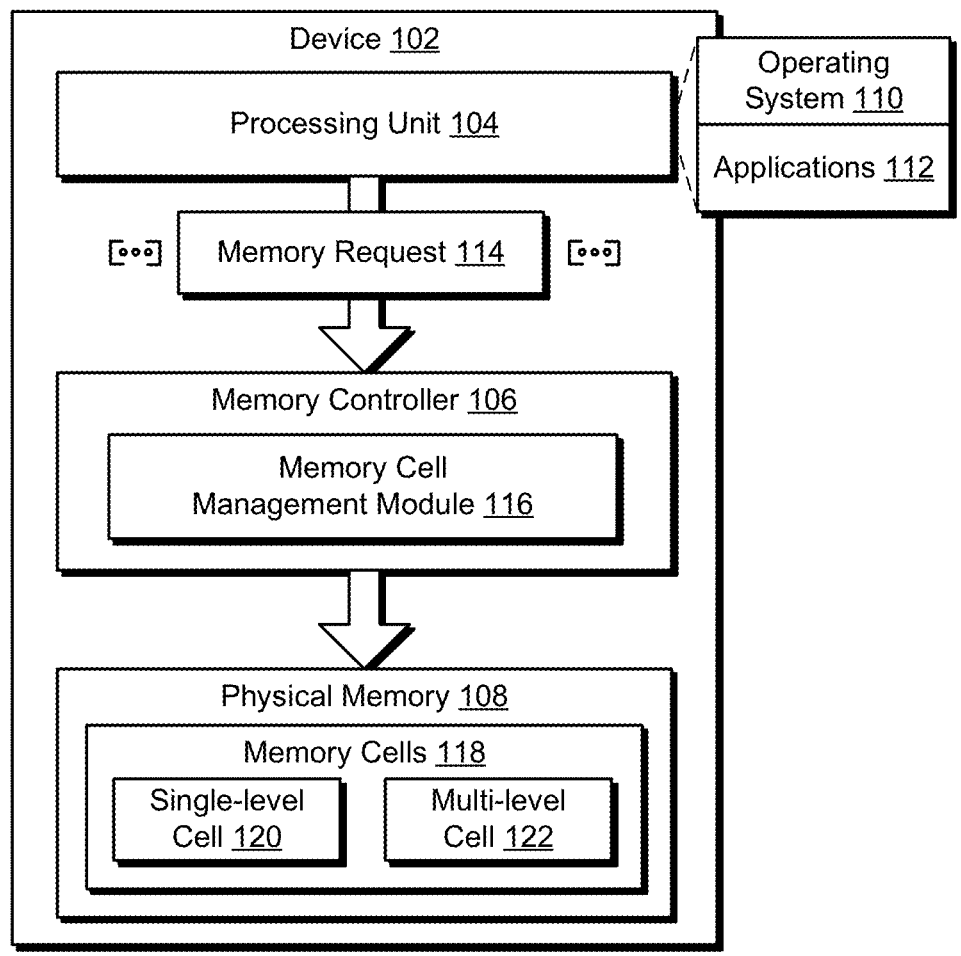
FIG. 1 is a block diagram of a non-limiting example system configured to employ multi-level cell memory management techniques.

Data storage has a direct effect on overall operation of computing devices. Because of these, techniques have been developed to expand the ways, in which, data is stored by these devices. However, in some instances these techniques also introduce challenges, which hinder operation in real world scenarios through introduction of errors caused by how the data is stored in physical memory.

An example of this involves use of multi-level cells to store data, e.g., to implement random access memory. Single-level cells, for instance, are configured to support two states including a "0" reset state and a "1" set state to store values for a bit. Multi-level cells have been subsequently developed to support an intermediate state in addition to the reset and set states, and as such, supports at least three states. A multi-level cell, for instance, is configurable to store two bits that includes a set state and a reset state as well as two intermediate states. Therefore, in this instance this multi-level cell is configurable to store values of "11" for a set state, "00" for a reset state, and "10" and "01" for the intermediate states and as such supports storage of two bits in a single cell.

To do so in one example, the multi-level cell is implemented as a phase-change memory using a phase-change material. The phase-change material supports different and definable amounts of resistance caused by respective degrees of crystallization of the phase-change material. The phase-change material, for instance, supports a fully crystalline state, an amorphous state, and different degrees of crystallization to support the intermediate states. This is performed, for instance, through use of a heating element and an electric current. An example of a phase-change material includes chalcogenide glass. Other examples are also contemplated, including use of laser pulses to cause state changes.

Multi-level memory cells, as implemented using phase-change material, support a variety of advantages includes scalability and negligible standby power. As described above, since the physical state of the phase-change material is not discrete, it is divisible into smaller regions to support intermediate states. As such, these multi-level cells have a smaller resistance margin for both sensing and programming but have the potential to increase memory storage capacity. However, in real-world scenarios repeated operations to change a state of the multi-level memory cells (e.g., resetting the cells) generates heat that reduces resistance of neighboring cells. This causes disturbance errors through this change in resistance including changes in values stored by the cells.

To solve these problems, multi-level cell memory management techniques are described. As part of this, a memory controller is configured to control how memory is stored by memory cells in physical memory. This is performable, for instance, to mitigate heat transfer between the memory cells, thereby overcoming limitations of conventional techniques that result in disturbance errors as described above.

In one example, the memory controller is configured to control whether a single-level cell operation or a multi-level cell operation to be used using different mapping schemes. The single-level cell operation, for instance, is usable to store a data word using two states (e.g., set and reset states), whereas the multi-level cell operation is usable to store the data word using four states, e.g., a set state, a reset state, and two intermediate states. In order to store the data word using two states, the memory controller is configurable to separate the data word across two word lines in the physical memory. This is performable through implementation of a mapping scheme by copying single bits from the data word as two bits in a multi-level memory cell, e.g., "00" or "11" for reset and set states, respectively. For the multi-level cell operation, the data word is stored in a single memory cell by leveraging the four states.

In an implementation, use of the different operations and corresponding mapping schemes by the memory controller alternates between adjacent word lines in the physical memory. The memory controller, for instance, is configured to implement a first mapping scheme to store memory requests involving even-numbered word lines using single-level cell operations, e.g., using two word lines and two states. On the other hand, the memory controller is also configured to implement a second mapping scheme to store memory requests involving odd-numbered word lines using multi-level cell operations, e.g., using a single word line in which individual cells leverage four states.

This supports inter-word line write disturbance mitigation through use of word lines that support two states and thus have a higher tolerance to heat disposed between words lines that are used to support four states. As such, operation of the memory controller expands a resistance margin of the multi-level memory cells while increasing data storage availability from the physical memory. A variety of other instances are also contemplated, examples of which are described in the following discussion and shown using corresponding figures.

In some aspects, the techniques described herein relate to a method including receiving, at a memory controller, a memory request, executing the memory request to physical memory using a multi-level cell operation based on the memory request meeting an intermediate state condition, and executing the memory request to the physical memory using a single-level cell operation based on the memory request not meeting the intermediate state condition.

In some aspects, the techniques described herein relate to a method, wherein the physical memory is implemented using a plurality of multi-level cells.

In some aspects, the techniques described herein relate to a method, wherein the plurality of multi-level cells is configured to support at least three states including a set state, a reset state, and at least one intermediate state.

In some aspects, the techniques described herein relate to a method, wherein the physical memory is a phase-change memory.

In some aspects, the techniques described herein relate to a method, wherein the phase-change memory is implemented using a plurality of memory cells, each said memory cell configured to indicate states through amounts of resistance caused by respective degrees of crystallization of a phase-change material.

In some aspects, the techniques described herein relate to a method, wherein the intermediate state condition is based on a characteristic of a word line, of a plurality of word lines of the physical memory, that is a subject of the memory request.

In some aspects, the techniques described herein relate to a method, wherein the characteristic is based on whether the word line corresponds to an odd number or an even number.

In some aspects, the techniques described herein relate to a method, wherein the single-level cell operation is configured to map a data word into two word lines, and wherein the multi-level cell operation is configured to map a data word into a single word line.

In some aspects, the techniques described herein relate to a method, wherein the single-level cell operation is configured to store a single bit of a data word in a respective memory cell of the physical memory by mapping the single bit as two copies in the respective memory cell using one of two states, and wherein the multi-level cell operation is configured to store a data word in a respective memory cell of the physical memory using one of four states.

In some aspects, the techniques described herein relate to a system including a physical memory including a memory array implemented using a plurality of multi-level cells, and a memory controller communicatively coupled to the physical memory, the memory controller is configured to control memory requests to the physical memory using single-level operations in which data is mapped to a respective said multi-level cell using two states, and multi-level operations in which data is mapped to the respective said multi-level cell using four states.

In some aspects, the techniques described herein relate to a system, wherein the plurality of multi-level cells is accessible using a plurality of word lines, and use of single-level operations and multi-level operations alternates between adjacent said word lines.

In some aspects, the techniques described herein relate to a system, wherein the data is not stored as part of single-level operations using an intermediate state.

In some aspects, the techniques described herein relate to a system, wherein the physical memory is a phase-change memory.

In some aspects, the techniques described herein relate to an apparatus including a memory controller configured to control a memory request to a physical memory using a plurality of multi-level mapping schemes that are selectable, based on a logic address of the memory request, to map a data word of the memory request to the physical memory.

In some aspects, the techniques described herein relate to an apparatus, wherein the physical memory is implemented using a plurality of multi-level cells, a first said multi-level mapping scheme is configured to cause the data word to be mapped to a respective said multi-level cell using two states, and a second said multi-level mapping scheme causes the data word to be mapped to a respective said multi-level cell using four states.

In some aspects, the techniques described herein relate to an apparatus, wherein the physical memory is accessible using a plurality of word lines, a first said multi-level mapping scheme is configured to cause the data word to be mapped into two said word lines, and a second said multi-level mapping scheme is configured to cause the data word to be mapped into a single said word line.

In some aspects, the techniques described herein relate to an apparatus, wherein the plurality of multi-level mapping schemes are selectable based on a characteristic of the logic address.

In some aspects, the techniques described herein relate to an apparatus, wherein the characteristic is based on whether the logic addresses corresponds to an odd numbered or an even numbered word line.

In some aspects, the techniques described herein relate to an apparatus, wherein the physical memory is a phase-change memory.

In some aspects, the techniques described herein relate to an apparatus, wherein the phase-change memory is implemented using a plurality of memory cells, each said memory cell configured to indicate states through amounts of resistance caused by respective degrees of crystallization of a phase-change material.

FIG. 1 is a block diagram of a non-limiting example system 100 configured to employ multi-level cell memory management techniques. The system 100 includes a device 102 having a processing unit 104, a memory controller 106, and physical memory 108 (e.g., volatile or nonvolatile memory) that are communicatively coupled, one to another. The device 102 is configurable in a variety of ways. Examples of which include, by way of example and not limitation, computing devices, servers, mobile devices (e.g., wearables, mobile phones, tablets, laptops), processors (e.g., graphics processing units, central processing units, and accelerators), digital signal processors, disk array controllers, hard disk drive host adapters, memory cards, solid-state drives, wireless communications hardware connections, Ethernet hardware connections, switches, bridges, network interface controllers, and other apparatus configurations. It is to be appreciated that in various implementations, the device 102 is configured as any one or more of those devices listed just above and/or a variety of other devices without departing from the spirit or scope of the described techniques.

In the illustrated example, the processing unit 104 executes software (e.g., an operating system 110, applications 112, etc.) to issue a memory request 114 to the memory controller 106. The memory request 114 is configurable to cause storage (e.g., programming) of data to physical memory as a write request or read data from the physical memory 108 as a read request.

The memory controller 106 is illustrated as including a memory cell management module 116 that is configured to manage use of memory cells 118 in the physical memory 108. Memory cells 118 are configured in hardware of the physical memory 108 as electronic circuits that are used to store data. A single-level cell 120, for instance, is usable to store a single bit as a logic "1" having a high voltage level or reset to store a logic "0" as a low voltage level. Multi-level cells 122, on the other hand, support an additional intermediate state between these voltage levels, thereby expanding an amount of data that is storable in the cell.

Figure 2:
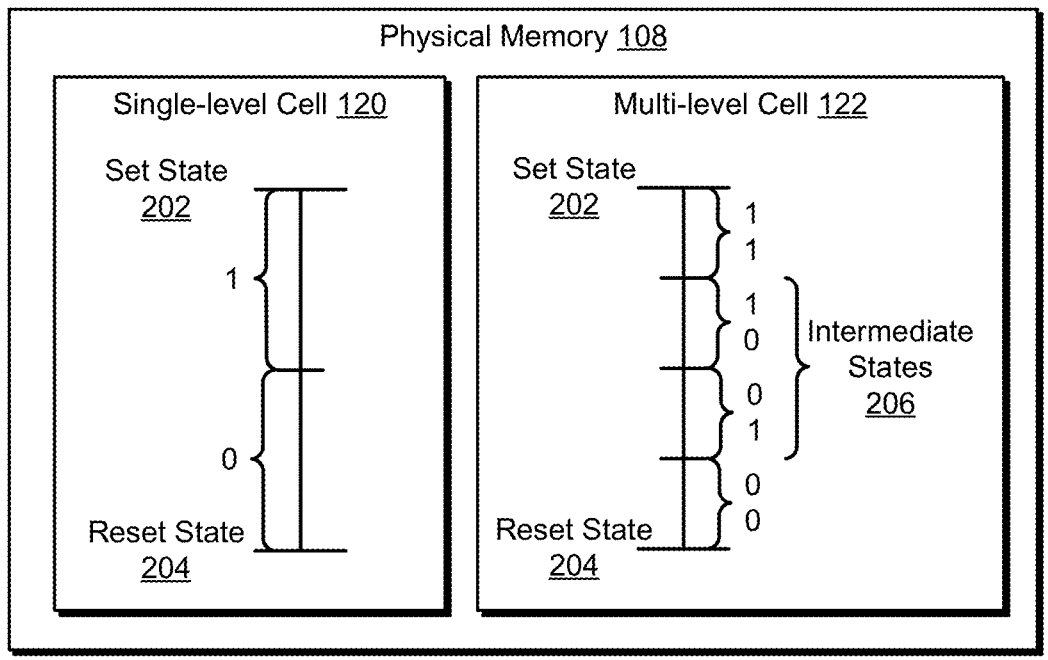
FIG. 2 is a block diagram of a non-limiting example system showing single-level cell operation and multi-level cell operation.

FIG. 2 is a block diagram of a non-limiting example system 200 showing single-level cell 120 operation and multi-level cell 122 operation. As described above, the demand for memory capacity is ever increasing. To address this, scaling has been employed to reduce a size and proximity of memory cells, which functions to compact additional memory cells into a same die area. However, these techniques encounter challenges involving higher power consumption and process variation.

To address this, multi-level cells 122 have been developed to increase memory capacity. Multi-level cells 122 provide a variety of technological advantages in terms of scalability, low access latency, and power consumption. In a single-level cell 120, a resistance range is logically divided into two regions to represent a set state 202 (e.g., a "1") and a reset state 204 (e.g., a "0") to represent a single bit of data. The multi-level cell 122 logically divides a resistance range to also include a set state 202 and a reset state 204 similar to the single-level cell 120. The multi-level cell 122 also supports an intermediate state 206, which in the illustrated example includes first and second intermediate states. Although two intermediate states are described in the following examples, a variety of other examples are also contemplated including a single intermediate state, more than two intermediate states, and so forth.

In this way, the multi-level cell 122 as a single cell is configured to represent two bits of data in the illustrated example using respective logical divisions of the resistance range. For example, the set state 202 is represented as "1,1" a reset state 204 is used represented as "0,0" and the first and second intermediate states are used to represent "1,0" and "0,1" respectively. As described above, the multi-level cell 122 is configurable using a phase-change material to define the different states. The phase-change material, for instance, is logically divided into regions forming the multi-level cells 122 which are used to determine a cell state when the cell is accessed. Since the physical state of the phase-change material is not discrete, it is divisible into smaller regions are shown in FIG. 2 to represent symbols, e.g., data words. Consequently, a multi-level cell 122 increases capacity of the physical memory 108 but has a smaller resistance margin for both sensing and programming when compared to a single-level cell 120.

Figure 3:
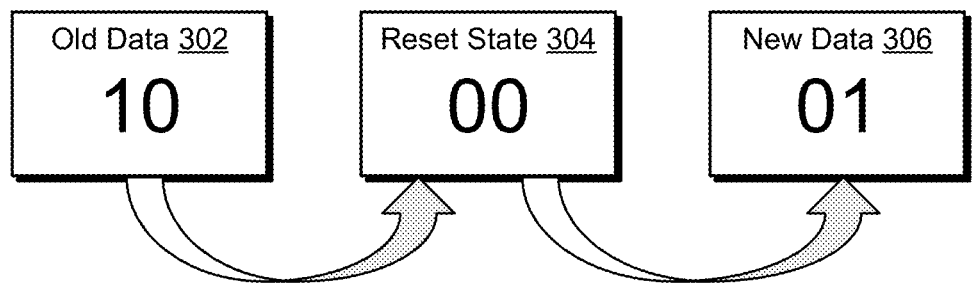
FIG. 3 is a block diagram of a non-limiting example system showing programming of a multi-level cell of FIG. 2.

FIG. 3 is a block diagram of a non-limiting example system 300 showing programming of a multi-level cell 122 of FIG. 2. To program the multi-level cell 122 to store data, old data 302 is read by the memory controller 106 from the multi-level cell 122. If the old data 302 and data to be written (i.e., new data) are not the same, the multi-level cell 122 is first reset by the memory controller 106. To do so, the multi-level cell 122 is first placed in a reset state 304 and then programmed with the new data 306. However, reset operations cause the multi-level cell 122 to produce heat in some instances. This heat can reduce a phase of phase-change material of a neighboring multi-level cell 122, thereby changing a resistance state and corresponding values.

In an encryption scenario, given four levels of multi-level cell 122, there is a likelihood that seventy-five percent of multi-level cells in any given write operation for encrypted data involve changing a cell state. Compared to multi-level cells 122, a probability of resetting a single-level cell 120 is fifty percent for encrypted data for any give write operation. Consequently, a multi-level cell 122 has an increased likelihood of disturbance errors due to increased likelihood of implementing a reset state as part of a write operation.

Figure 4:
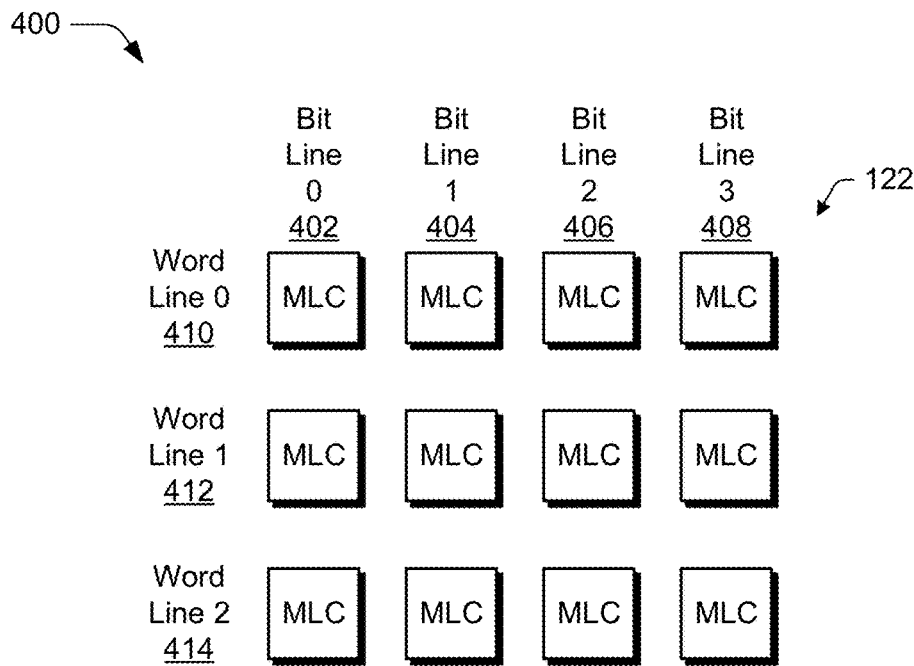
FIG. 4 is a block diagram of a non-limiting example system showing configuration of multi-level cells of a physical memory as a memory array that is accessed via word lines and bit lines.

FIG. 4 is a block diagram of a non-limiting example system showing configuration of multi-level cells 122 of the physical memory 108 as a memory array 400 that is accessed via word lines and bit lines. The memory array 400 as illustrated includes a plurality of bit lines, examples of which include bit line "0" 402, bit line "1" 404, bit line "2" 406, and bit line "3" 408. The memory array 400 also includes a plurality of word lines, examples of which include word line "0" 410, word line "1" 412, and word line "2" 414. Word lines control transfer line gates, whereas bit lines are connected to sense amplifiers. In this way, the word and bit lines are used by the memory controller 106 to access to respective multi-level cells 122, e.g., to read from a respective multi-level cell 122 or to write to a respective multi-level cell 122.

Figure 5:
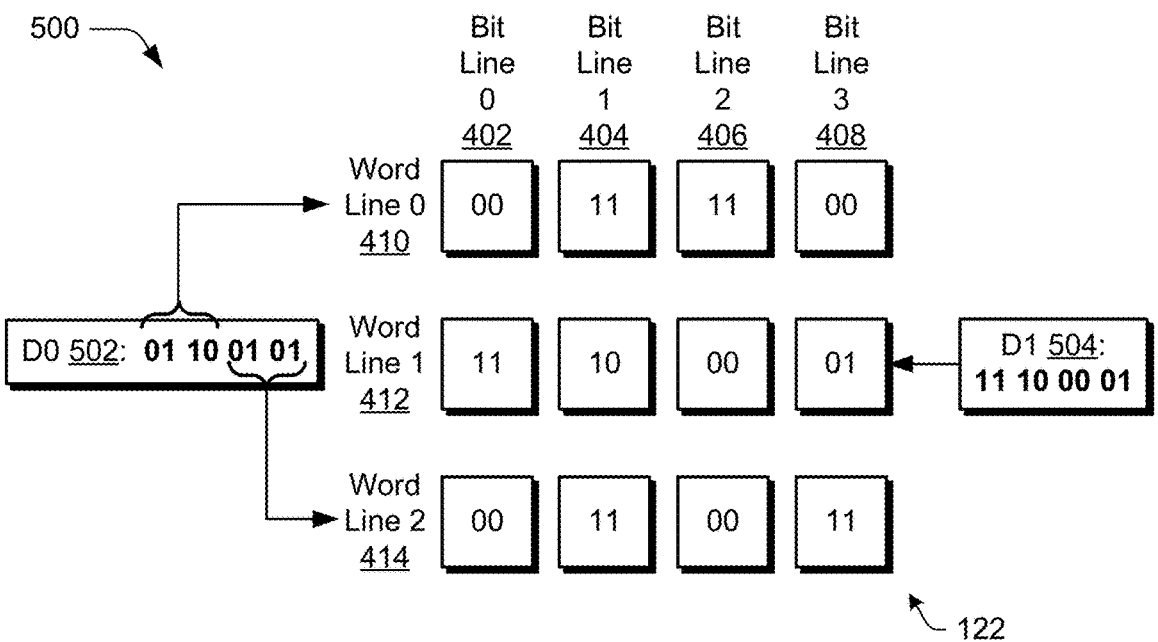
FIG. 5 is a block diagram of a non-limiting example system showing an example of control of memory request access by a memory controller based on whether an intermediate state condition is met.

FIG. 5 is a block diagram of a non-limiting example system 500 showing an example of control of memory request access by a memory controller based on whether an intermediate condition is met. In this example, the memory controller 106 controls access to respective word lines of the memory array of physical memory 108 using single-level cell operations and multi-level cell operations implemented using respective mapping schemes. Each of the memory cells in this example are implemented as multi-level cells 122. However, operations used to access those cells differs based on an intermediate state condition used to mitigate write disturbances.

A single-level cell operation, for instance, is used to increase resistance margins similar to those used in single-level cells 120 as shown in FIG. 2 such that a set state 202 or a reset state 204 are used, solely, as part of these operations. In this way, the single-level cell operation is used in a first mapping scheme such that operation of the multi-level cell 122 mimics operation of a single-level cell 120. On the other hand, a second mapping scheme employs multi-level cell operations that leverage resistance margins available via the multi-level cell 122, e.g., to support addition of one or more intermediate states 206, and thus increase memory storage capacity.

In an implementation, the memory controller 106 controls which operations to use, and therefore which mapping schemes to employ, based on an intermediate state condition that leverages characteristics of word lines associated with the memory request 114. The memory controller 106, for instance, is configurable to control access to the memory array to select between use of single-level and multi-level cell operations. Use of the single-level operations and multi-level operations, for instance, alternates between adjacent word lines in the memory array. This operates to mitigate heat spread from the multi-level word lines to single-level word lines that have increased resistance margins and thus have increased protection from heat transfer. As a result, operation of both word lines is improved to protect data accuracy as well as expand an amount of data that is storable in the physical memory 108.

In an example, the intermediate state condition is based on a characteristic of a word line that is associated with the memory request 114. The memory controller 106, for instance, is configured to employ different mapping schemes and associated operations. This is based on which word lines are indicated in the memory request 114 to cause alternating single-level cell operations and multi-level cell through successive and adjacent word lines in the memory array 400.

In an implementation, the memory controller 106 bases use of the different mapping schemes based on an intermediate state condition specifying whether the memory request 114 pertains to an odd numbered or even numbered word line. Therefore, the memory controller 106 increases a resistance marge of a reset state for even-numbered word lines through use of single-level cell operation that is limited to use of two states, i.e., the set state and reset state. Remaining resistance margins of the multi-level cells 122 remain unchanged in odd-numbered word lines via use of set, reset, and intermediate states.

As a result, use of the mapping schemes and associated operations expands a resistance margin of reset states from one to three times for even-numbered word lines and as such supports improved protect against disturbance errors. Although heat reduces resistance of the multi-level cells 122, the cells in set states are not disturbed because these cells have minimum resistance compared to other states.

The memory controller 106, for instance, first determines whether the intermediate state condition is met. The intermediate state condition, for instance, is based on whether the associated word line address has an odd number and thus is to be written using intermediate states or an even number and thus is written without use of intermediate states.

In the illustrated example of FIG. 5, a first data word (e.g., D0 502) includes values of "01 10 01 01" forming four two-bit symbols to be written to a word line "0" 410. Upon receipt of this first data word, the memory controller 106 determines the memory request involves an even-numbered word line. As such, the intermediate state condition is not met in this example, i.e., intermediate states are not to be used as part of writing the data word to the physical memory 108. Accordingly, the memory controller 106 employs a mapping scheme that utilizes single-level cell operations to write values of the data word to two word lines.

To do so in this example, the memory controller 106 divides the data word "D0" into two sub data words "01 10" and "01 01." The two sub data words are then mapped to multi-level cells 122 in word line "0" 410 and word line "2" 414 by copying (e.g., repeating) single bits in the data word to respective cells. The memory controller 106 as illustrated maps bits from sub word "01 10" into four multi-level cells 122 of word line "0" 410 where bit "0" is mapped to a reset set "00," bit "1" is mapped to a set state "11," and so on. This process is repeated for sub word "01 01" to map bits to word line 2 414. Thus, in this example individual instances of the multi-level cells 122 are used to represent single bits from the data word using this mapping scheme. Through use of the single-level cell operations, the multi-level cells 122 in these word lines have large resistance margins as shown in FIG. 2, thereby providing improved protection from disturbances (e.g., heat transfer) from neighboring word lines.

In order to take advantage of increased storage capacity of the multi-level cell 122, multi-level cell operations are implemented for odd numbered word lines by permitting use of intermediate states. A second data word (e.g., D1 504), for instance, includes values of "11 10 00 01" forming four two-bit symbols to be written to a word line "1" 412. Upon receipt of this second data word, the memory controller 106 determines the memory request involves an odd-numbered word line, e.g., word line "1" 412. Accordingly, the memory controller 106 employs a mapping scheme that utilizes multi-level cell operations to write values of the data word to single word line using four different states. Therefore, in this example increased capacity of configuration of multi-level cell 122 is utilized.

Figure 6:
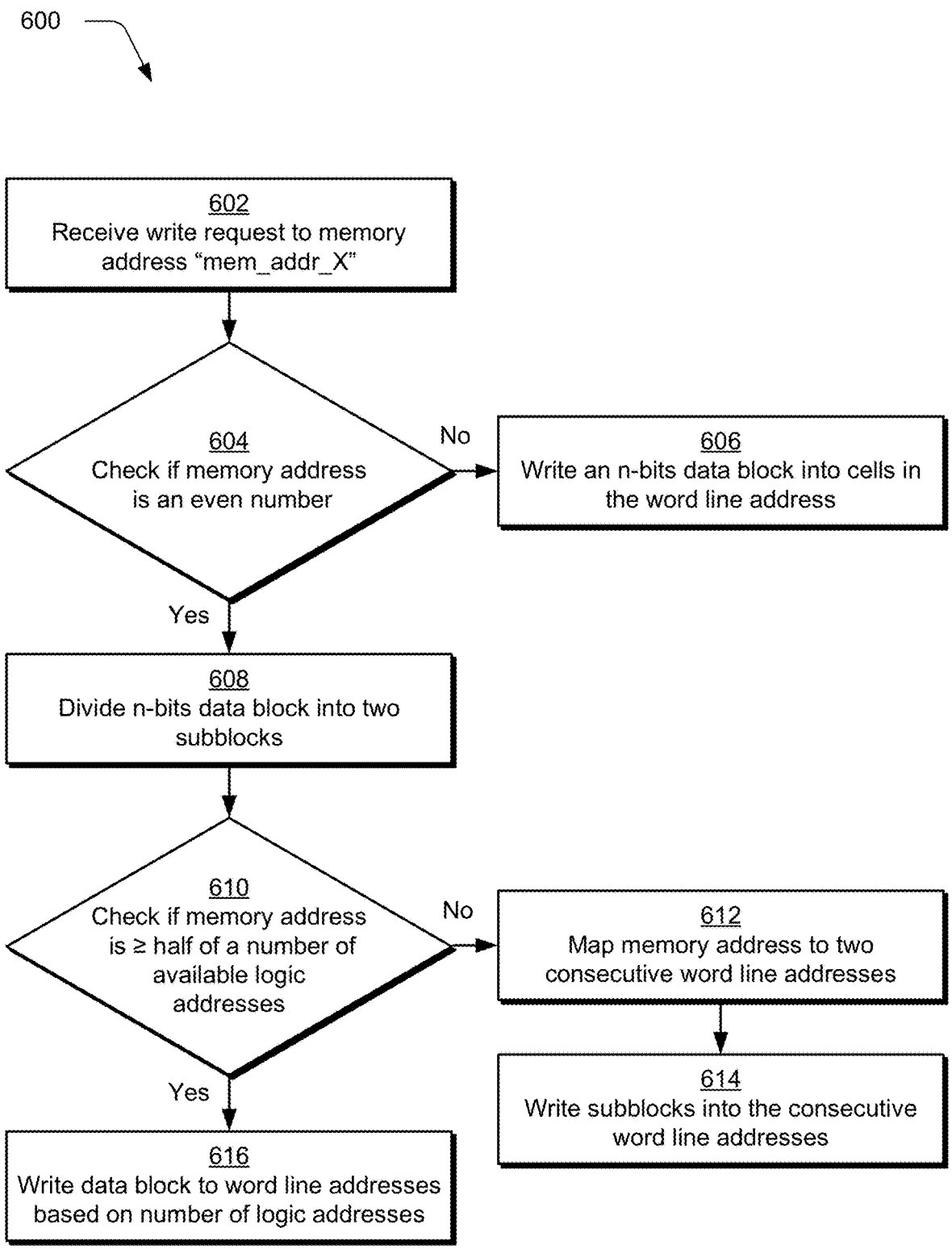
FIG. 6 depicts a flow chart in an example implementation of a writing process to word lines implemented using multi-level cells.

FIG. 6 depicts a flow chart 600 in an example implementation of a writing process to word lines implemented using multi-level cells. Logic addresses, in support of virtual memory, is a technique to manage use of shared physical memory. Virtual memory supports a variety of different functionality. Examples of this functionality include expansion of an amount of storage made available to applications beyond that which is actually available in the physical memory, offload memory management from applications and operating systems, use of a variety of different types of memory without the applications being made aware, support memory optimization, address memory fragmentation, and so forth. To implement this, the memory controller 106 is configured to support translation between the logic addresses and physical addresses.

Accordingly, in this example, characteristics of the logic address (e.g., a corresponding word line referenced by the logic address) is used by the memory controller 106 to control use of mapping schemes and corresponding operations. A write request, for instance, is received by the memory controller 106 to memory address (block 602), e.g., "mem_addr_X". In response, the memory controller 106 checks whether the memory address is an even number (decision block 604).

If "no" from decision block 604 in that the memory address "mem_addr_X" is odd, the memory controller 106 writes an n-bits data block into cells in the word line address (block 606). By way of example, the memory controller 106 writes an n-bits data block into cells in the word line address where each cell stores two bits of data.

If "yes" from decision block 604 in that the memory address "mem_addr_X" is even, the n-bits data block is divided by the memory controller 106 into two subblocks (block 608).

The memory controller 106 then checks if the memory address is greater than or equal to half of a number of available logic addresses (decision block 610). If "no" from decision block 610, the memory controller 106 maps the memory address to two consecutive word line addresses (block 612). The subblocks are then written into the consecutive word line addresses (block 614).

If "yes" from decision block 610, the memory controller 106 maps the memory address to word line addresses based on a number of available logical addresses (block 616). By way of example, if "mem_addr_X" is even and "mem_addr_X" is greater than or equal to a number of logical addresses divided by 2, subblocks are written to respective targeted word lines.

Figure 7:
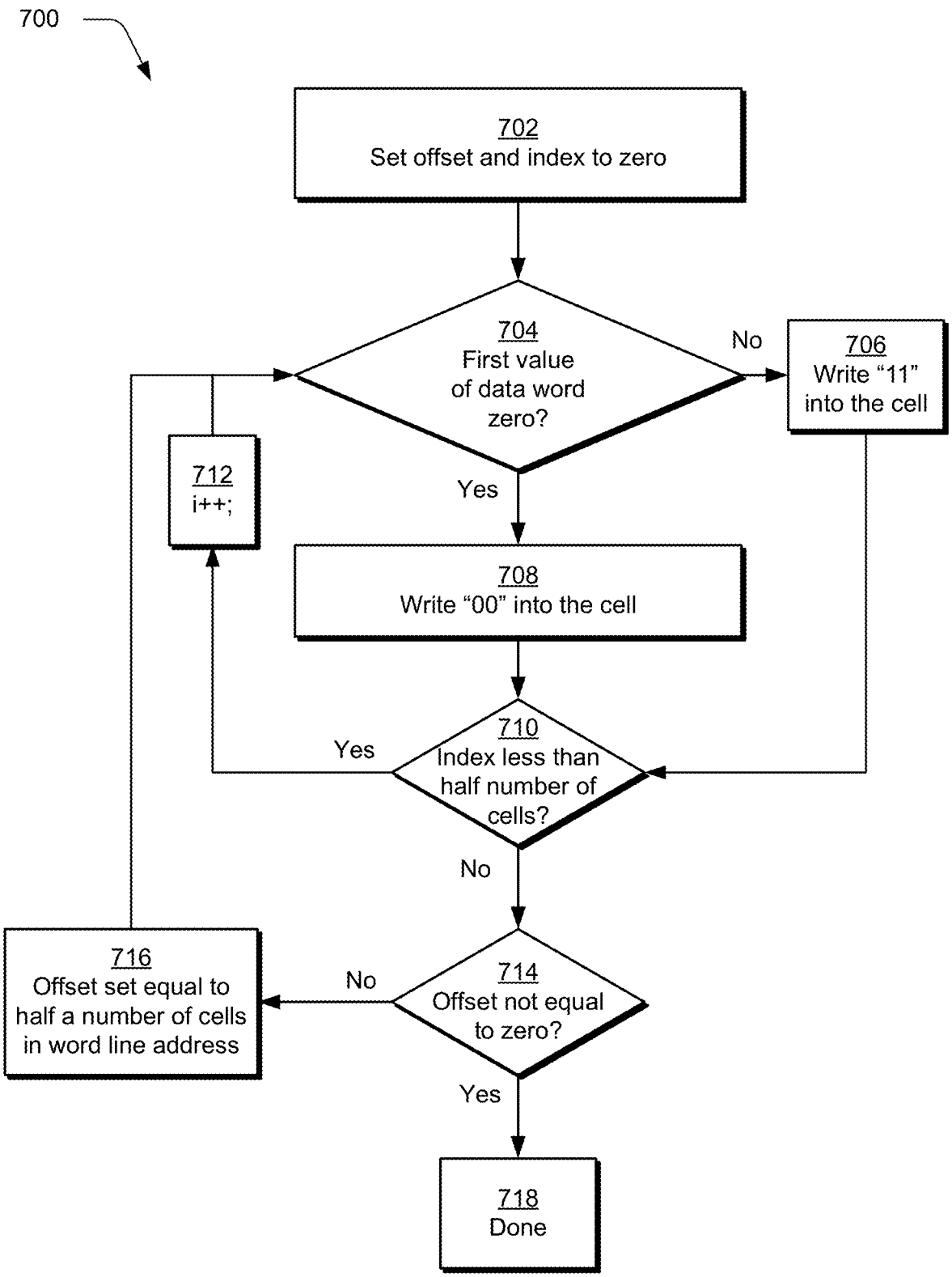
FIG. 7 depicts a flow chart in an example implementation of a writing process for even word lines.

FIG. 7 depicts a flow chart 700 in an example implementation of a writing process for even word lines. An offset and index "i" is initially set to zero and the process begins for writing to a "targeted_wordline_0" (block 702) in this example.

A determination is made as to whether a first value of the data word is zero (decision block 704). If not ("no" from decision block 704), the memory controller 106 writes "11" into the cell (block 706). If so ("yes" from decision block 706), the memory controller 106 writes "00" into the cell (block 708).

A determination is then made as to whether the index "i" is less than a number of cells (n/2) (decision block 710). If so ("yes" from decision block 710), the index "i" is incremented (block 712) and the process returns to decision block 704 to evaluate a next value of the data word. If not ("no" from decision block 710) a determination is made as to whether of the offset is not equal to zero (decision block 714). If the offset is equal to zero ("no" from decision block 714), the offset is set equal to a half a number of cells in the word line address (e.g., n/2), the index is set as zero, and the process proceeds to write to another word line, e.g., "targeted_wordline_1," (block 716). If the offset is not equal to zero ("yes" from decision block 714), the process completes (block 718).

To read from the physical memory 108, the memory controller 106 examines the memory address "mem_addr_X." If it involves an odd-numbered word line, the memory controller 106 reads from the corresponding word line in the physical memory 108. If it involves an even-numbered word line, the memory controller 106 locates both even numbered lines.

Figure 8:
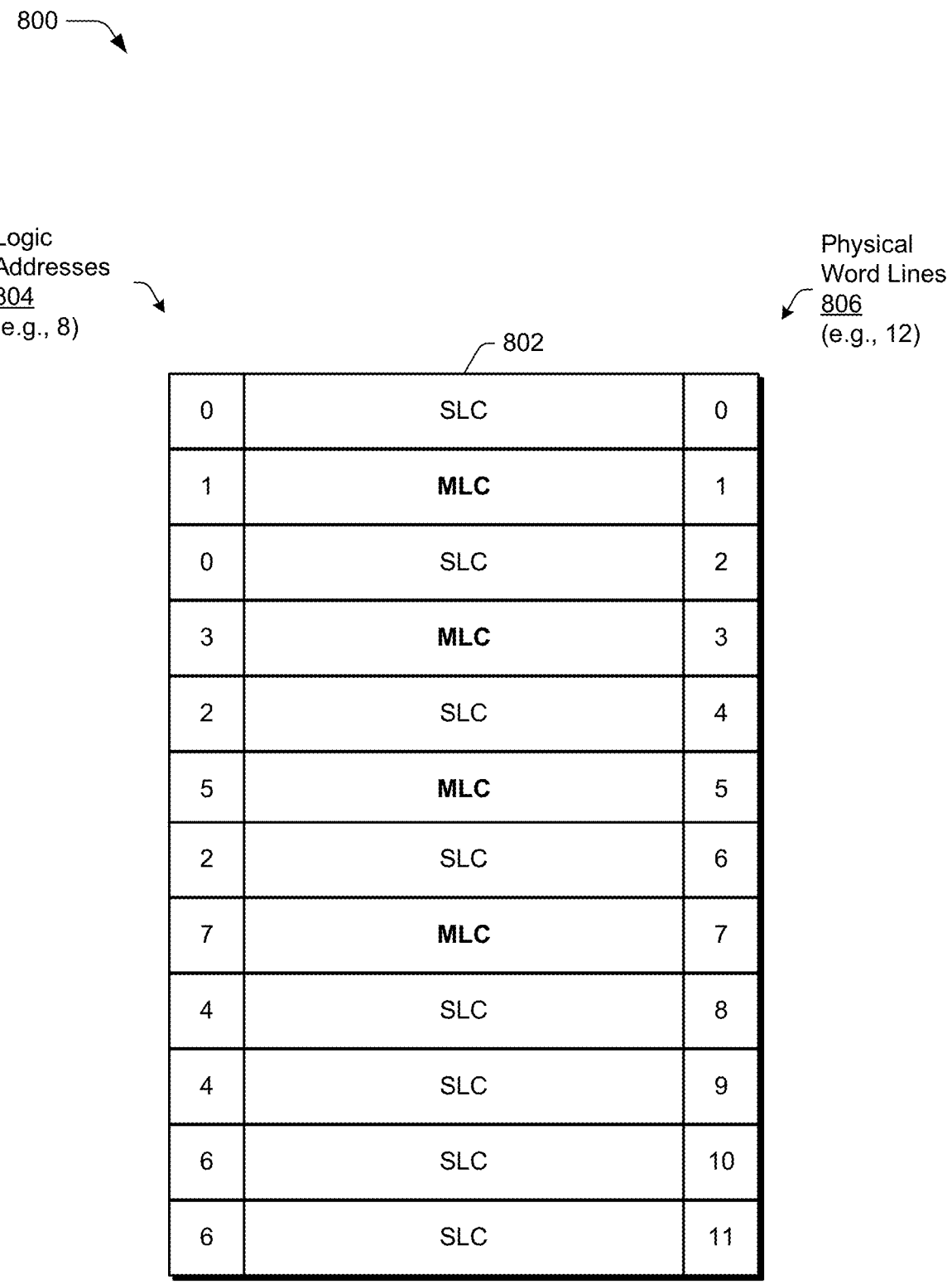
FIG. 8 is a block diagram of a non-limiting example of a mapping scheme for a first half of a word line.

FIG. 8 is a block diagram of a non-limiting example 800 of a mapping scheme 802 for a first half of a word line. In this example, word lines of eight logic addresses 804 are mapped to twelve physical word lines 806. Single-level cell operations (depicted as "SLC") are utilized for even-numbered word lines of the logic addresses 804 and multi-level cell operations (depicted as "MLC") are utilized for odd-numbered word lines of the logic addresses 804.

Accordingly, logic addresses 804 corresponding to odd-numbered word lines of "1," "3," "5," and "7" are mapped to corresponding physical word lines 806 of "1," "3," "5," and "7" using multi-level cell operations, e.g., using four bits per multi-level cell 122. Even-numbered word lines of the logic addresses 804, on the other hand, are spit to first and second physical word lines 806. For example, logic address 804 specifying word line "0" is split to physical word lines 806 of "0" and "2" using single-level cell operations. Logic address 804 corresponding to word line "2" is split to physical word lines 806 of "4" and "6." Logic address 804 indicating word line "4" is split to physical word lines 806 of "8" and "9." And logic address 804 corresponding to word line "6" is split using single-level cell operations to physical word lines 806 "10" and "11" by the memory controller 106.

FIG. 9 is a block diagram of a non-limiting example 900 of a mapping scheme 902 for a second half of a word line. In this example, sixteen word lines of logic addresses 904 are mapped to twenty-four physical word lines 906 by the memory controller 106. Single-level cell operations (depicted as "SLC) are utilized for even-numbered word lines of the logic addresses 904 and multi-level cell operations (depicted as "MLC") are utilized for odd-numbered word lines of the logic addresses 904. Similar to the above, logic addresses 904 corresponding to odd-numbered word lines of "1," "3," "5," "7," "9," "11," and "15" are mapped by the memory controller 106 to corresponding physical word lines 906 of "1," "3," "5," "7," "9," "11," and "15" using multi-level cell operations, e.g., using four bits per multi-level cell 122.

Even-numbered word lines of logic addresses 904, on the other hand, are divided across two of the physical word lines 906. For example, logic address 904 specifying word line "0" is split across physical word lines 906 of "0" and "2" using single-level cell operations. Logic address 904 indicating word line "2" is split to physical word lines 906 of "4" and "6." Logic address 904 corresponding to word line "4" is split to physical word lines 906 of "8" and "10." Logic address 904 of word line "6" is split to physical word lines 906 of "12" and "14." Logic address 904 corresponding to word line "8" is split using consecutive physical word lines 906 of "16" and "17." Likewise, logic address 904 corresponding to word line "10" is split using consecutive physical word lines 906 of "18" and "19," logic address 904 corresponding to word line "12" is split using consecutive physical word lines 906 of "20" and "21," and logic address 904 corresponding to word line "14" is split using consecutive physical word lines 906 of "22" and "23."

Figure 10:
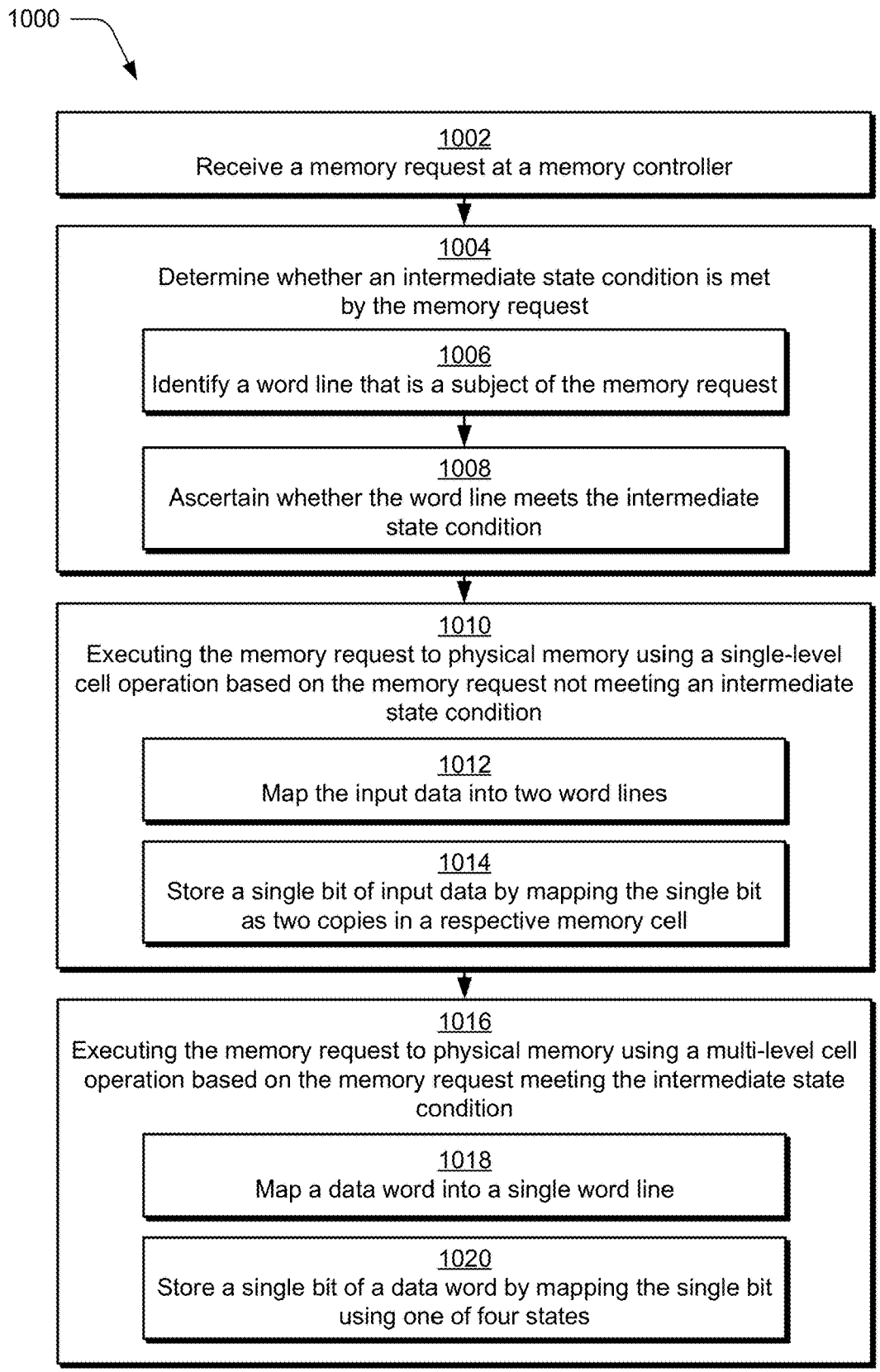
FIG. 10 depicts a procedure in an example implementation of multi-level cell memory management using intermediate state conditions.

FIG. 10 depicts a procedure 1000 in an example implementation of multi-level cell memory management using intermediate state conditions. A memory request is received at a memory controller (block 1002). By way of example, a memory request 114 is received by the memory controller 106, e.g., from software executing on the processing unit 104.

A determination is made as to whether an intermediate state condition is met by the memory requested (block 1004). By way of example, a memory cell management module 116 of a memory controller 106 identifies a word line that is a subject of the memory request (block 1006), e.g., a virtual word line. The memory controller 106 then ascertains whether the word line meets the intermediate state condition (block 1008). By way of example, the memory controller 106 determines whether the word line corresponds to an odd-numbered virtual word line.

The memory request 114 is executed to physical memory 108 using a single-level cell operation based on the memory request not meeting an intermediate state condition (block 1010). By way of example, the memory request 114 is a read request or a write request. In a first example, the input data is mapped into two word lines (block 1012). In a second example, a single bit of the input data is stored by mapping the single bit as two copies in a respective memory cell (block 1014).

The memory controller 106 executes the memory request to physical memory 108 using a multi-level cell operation based on the memory request meeting the intermediate state condition (block 1016). By way of example, the memory request 114 is a read request or a write request. By way of example, the memory controller 106 determines whether the word line corresponds to an even-numbered virtual word line. In response, a data word is mapped into a single word line (block 1018). In another instance, a single bit of the data word is stored by mapping the single bit using one of four states (block 1020).

Figure 11:
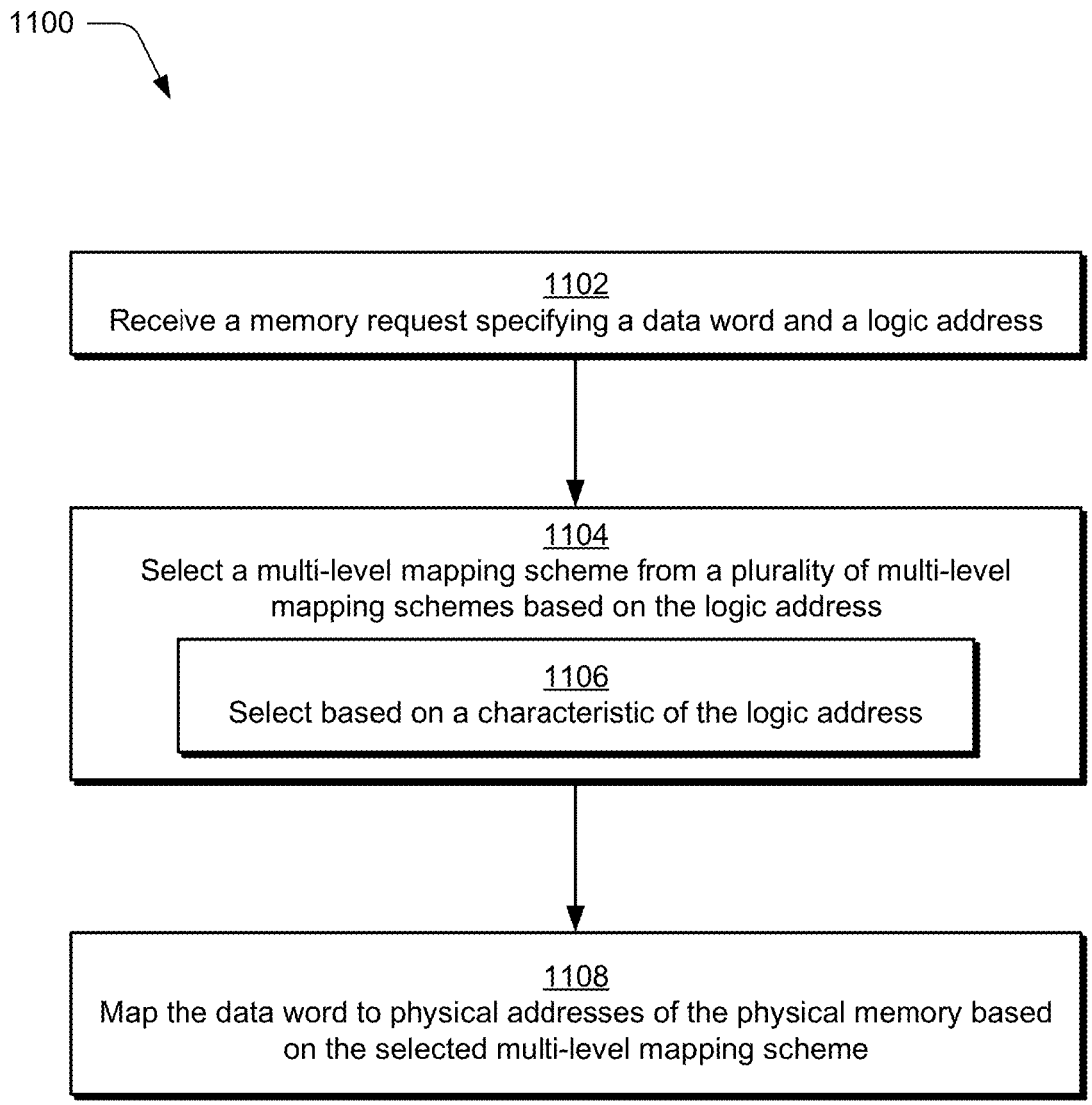
FIG. 11 depicts a procedure in an example implementation of multi-level cell memory management based on a data word and logic address of a memory request.

FIG. 11 depicts a procedure 1100 in an example implementation of multi-level cell memory management based on a data word and logic address of a memory request. A memory request is received specifying a data word and a logic address (block 1102). By way of example, the logic address is utilized to implement virtual memory by the memory controller 106.

A multi-level mapping scheme is selected from a plurality of multi-level mapping schemes based on the logic address (block 1104). By way of example, the selection is based on a characteristic of the logic address (block 1106), e.g., odd numbered or even numbered word lines. A first multi-level mapping scheme, for instance, specifies use of single-level cell operations involving two states and multiple word lines. In another instance, a second multi-level mapping scheme specifies use of multi-level cell operations involving more than two states (e.g., four states) and a single word line.

The data word is mapped to physical addresses of the physical memory based on the selected multi-level mapping scheme (block 1108). By way of example, the data word is mapped to respective physical word lines 806, 906 of the physical memory 108 based on a respective scheme. A variety of other examples are also contemplated.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the device 102) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Although the systems and techniques have been described in language specific to structural features and/or methodological acts, it is to be understood that the systems and techniques defined in the appended claims are not necessarily limited to the specific features or acts described. Rather, the specific features and acts are disclosed as example forms of implementing the claimed subject matter.

What is claimed is:

1. A method comprising:
receiving, at a memory controller, a memory request;
executing the memory request to physical memory using a multi-level cell operation based on the memory request meeting an intermediate state condition, wherein the multi-level cell operation is configured to store a data word in a respective memory cell of the physical memory using one of four states; and
executing the memory request to the physical memory using a single-level cell operation based on the memory request not meeting the intermediate state condition, wherein the single-level cell operation is configured to store a single bit of a data word in a respective memory cell of the physical memory by mapping the single bit as two copies in the respective memory cell using one of two states.

2. The method of claim 1, wherein the physical memory is implemented using a plurality of multi-level cells.

3. The method of claim 2, wherein the plurality of multi-level cells is configured to support at least three states including a set state, a reset state, and at least one intermediate state.

4. The method of claim 1, wherein the physical memory is a phase-change memory.

5. The method of claim 4, wherein the phase-change memory is implemented using a plurality of memory cells, each said memory cell configured to indicate states through amounts of resistance caused by respective degrees of crystallization of a phase-change material.

6. The method of claim 1, wherein the intermediate state condition is based on a characteristic of a word line, of a plurality of word lines of the physical memory, that is a subject of the memory request.

7. The method of claim 6, wherein the characteristic is based on whether the word line corresponds to an odd number or an even number.

8. The method of claim 1, wherein:
the single-level cell operation is configured to map a data word into two word lines; and
the multi-level cell operation is configured to map a data word into a single word line.

9. A system comprising:
a physical memory including a memory array implemented using a plurality of multi-level cells; and
a memory controller communicatively coupled to the physical memory, the memory controller configured to control memory requests to the physical memory using:
single-level operations in which data is mapped to a respective said multi-level cell using two states; and
multi-level operations in which data is mapped to the respective said multi-level cell using four states, the memory controller configured to select the single-level operations or the multi-level operations based on whether a respective memory request corresponds to an odd numbered or an even numbered word line.

10. The system of claim 9, wherein:
the plurality of multi-level cells is accessible using a plurality of word lines; and
use of single-level operations and multi-level operations alternates between adjacent said word lines.

11. The system of claim 9, wherein the data is not stored as part of single-level operations using an intermediate state.

12. The system of claim 9, wherein the physical memory is a phase-change memory.

13. An apparatus comprising:
a memory controller configured to control a memory request to a physical memory using a plurality of multi-level mapping schemes that are selectable, based on whether a logic address of the memory request corresponds to an odd numbered or an even numbered word line, to map a data word of the memory request to the physical memory.

14. The apparatus of claim 13, wherein:
the physical memory is implemented using a plurality of multi-level cells;
a first said multi-level mapping scheme is configured to cause the data word to be mapped to a respective said multi-level cell using two states; and
a second said multi-level mapping scheme causes the data word to be mapped to a respective said multi-level cell using four states.

15. The apparatus of claim 13, wherein:
the physical memory is accessible using a plurality of word lines;
a first said multi-level mapping scheme is configured to cause the data word to be mapped into two said word lines; and
a second said multi-level mapping scheme is configured to cause the data word to be mapped into a single said word line.

16. The apparatus of claim 13, wherein the physical memory is a phase-change memory.

17. The apparatus of claim 16, wherein the phase-change memory is implemented using a plurality of memory cells, each said memory cell configured to indicate states through amounts of resistance caused by respective degrees of crystallization of a phase-change material.

18. The apparatus of claim 13, wherein the physical memory is implemented using a plurality of multi-level cells.

19. The apparatus of claim 18, wherein the plurality of multi-level cells is configured to support at least three states.

20. The apparatus of claim 19, wherein the at least three states include a set state, a reset state, and at least one intermediate state.

* * * * *